United States Patent
Kim et al.

(10) Patent No.: US 8,886,129 B2
(45) Date of Patent: Nov. 11, 2014

(54) METHOD AND DEVICE FOR EVALUATING INFLUENCE OF ELECTROMAGNETIC WAVES OF BASE STATION ON HUMAN BODY

(75) Inventors: Byung Chan Kim, Daejeon (KR); Je Hoon Yun, Daejeon (KR); Chang Joo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 172 days.

(21) Appl. No.: 13/699,685

(22) PCT Filed: May 25, 2011

(86) PCT No.: PCT/KR2011/003815
§ 371 (c)(1),
(2), (4) Date: Nov. 23, 2012

(87) PCT Pub. No.: WO2011/149258
PCT Pub. Date: Dec. 1, 2011

(65) Prior Publication Data
US 2013/0065536 A1    Mar. 14, 2013

(30) Foreign Application Priority Data

May 25, 2010    (KR) .................... 10-2010-0048701
May 23, 2011    (KR) .................... 10-2011-0048458

(51) Int. Cl.
*H04B 17/00*     (2006.01)
*G01R 29/08*     (2006.01)
(52) U.S. Cl.
CPC ........ *G01R 29/0814* (2013.01); *G01R 29/0857* (2013.01); *G01R 29/0892* (2013.01)

USPC ................. 455/67.11; 455/100; 455/115.3
(58) Field of Classification Search
USPC .......... 455/41.1, 41.2, 67.11, 100, 115.3
See application file for complete search history.

(56) References Cited

U.S. PATENT DOCUMENTS

| | | | | |
|---|---|---|---|---|
| 2004/0183529 | A1* | 9/2004 | Kajiwara et al. | 324/247 |
| 2005/0190815 | A1* | 9/2005 | Lee et al. | 374/122 |

FOREIGN PATENT DOCUMENTS

| | | |
|---|---|---|
| JP | 07092110 A | 4/1995 |
| JP | 2004264143 A | 9/2004 |
| JP | 2005118573 A | 5/2005 |
| JP | 2005331391 A | 12/2005 |
| KR | 1020080034566 A | 4/2008 |

* cited by examiner

*Primary Examiner* — Tuan H Nguyen
(74) *Attorney, Agent, or Firm* — William Park & Associates Patent Ltd.

(57) ABSTRACT

The present invention relates to a method for reducing an average time period adopted at the time of evaluating an effect of electromagnetic fields of a mobile communication base station near the mobile communication base station on a human body and measurement is performed for 6 minutes at a predetermined measurement point for acquiring a whole body average by comparing a site measurement result targeting multiple base stations and uncertainty by repetitive measurement and when a 6-minute average value and an average value for a reduced time period which is shorter than 6 minutes are compared with each other, a standard deviation is equal to or lower than a predetermined level, e.g., 0.4 dB, it is sufficient even by the measurement for the reduced time period which is shorter than 6 minutes.

10 Claims, 5 Drawing Sheets

FIG. 2

| TIME PERIOD (sec) / BASE STATION | 360 | 180 | 120 | 60 | 50 | 40 | 30 | 20 | 10 |
|---|---|---|---|---|---|---|---|---|---|
| 1 | 109.14 | 109.14 | 109.15 | 109.16 | 109.15 | 109.14 | 109.10 | 109.09 | 109.08 |
| 2 | 109.80 | 109.79 | 109.78 | 109.79 | 109.79 | 109.79 | 109.78 | 109.79 | 109.80 |
| 3 | 107.07 | 107.07 | 107.07 | 107.09 | 107.09 | 107.07 | 107.10 | 107.10 | 107.11 |
| 4 | 111.59 | 111.55 | 111.55 | 111.60 | 111.61 | 111.63 | 111.67 | 111.73 | 111.81 |
| 5 | 92.56 | 92.36 | 92.39 | 92.34 | 92.35 | 92.33 | 92.33 | 92.37 | 92.56 |
| 6 | 90.41 | 90.28 | 90.36 | 90.76 | 90.96 | 90.84 | 90.82 | 90.93 | 90.74 |
| 7 | 97.38 | 97.26 | 97.32 | 97.39 | 97.40 | 97.40 | 97.36 | 97.38 | 97.67 |

METHOD AND DEVICE FOR EVALUATING INFLUENCE OF ELECTROMAGNETIC WAVES OF BASE STATION ON HUMAN BODY

TECHNICAL FIELD

The present invention relates to a method and an apparatus for evaluating an effect of electromagnetic fields radiated from a mobile base station on a human body near the mobile base station, and more particularly, to a method and an apparatus for evaluation that are capable of reducing a time period applied at the time of evaluating the effect of the electromagnetic fields radiated from the mobile base station on the human body.

BACKGROUND ART

Due to a rapid increase of base stations for mobile communication, concerns about electromagnetic fields radiated from a base station have greatly increased.

As a result, in order to protect people from a latent risk which may occur by being exposed to electromagnetic fields radiated from the base station, International Commission on Non-Ionizing Radiation Protection (ICNIRP) proposes basic restrictions and reference levels and recommends taking a whole-body average in the case of evaluating a human body exposure amount in a far field. As a result, Korea has also established a standard for protecting the human body based on the recommendations of the ICNIRP.

DISCLOSURE

Technical Problem

The present invention is contrived according to the above-mentioned technical background and an object of the present invention is to provide a method and an apparatus for evaluation capable of reducing a time period required for measurement in evaluating an effect of electromagnetic fields radiated from a mobile base station on a human body near the mobile base station.

Another object of the present invention is to provide a method and an apparatus capable of evaluating an accurate effect on the human body while reducing a time period required evaluating the effect of the electromagnetic fields of the mobile base station on the human body.

Technical Solution

According to an aspect of the present invention, a method for evaluating an effect of electromagnetic fields radiated from a mobile communication base station on a human body near the mobile communication base station includes: measuring the electric field strength for 6 minutes at a first measurement point which is a predetermined measurement point for acquiring a whole body average of the effect on the human body; calculating and comparing a 6-minute average value and an average value for a first time period which is less than 6 minutes based on the measurement result of the intensity of the electric field measured for 6 minutes to judge whether a first standard deviation which is a standard deviation of the 6-minute average value and the average value for the first time period is equal to or less than a predetermined threshold; and determining the average value of measurement values for the first time period at the measurement points when the first standard deviation is equal to or less than the predetermined threshold as an evaluation value of the effect on the human body.

Herein, the first time period may be 1 minute and the threshold may be 0.4 dB.

The method may further include determining an average value of measurement values for 6 minutes at the measurement points as the evaluation value of the effect on the human body when the first standard deviation is more than the predetermined threshold or alternatively, further include: calculating and comparing the 6-minute average value and an average value for a second time period acquired by adding a first time period interval to the first time period when the first standard deviation is more than the threshold to judge whether a second standard deviation which is a standard deviation between the 6-minute average value and an average value for the second time period is equal to or less than the threshold; and determining the average value of measurement values for the second time period at the measurement points when the second standard deviation is equal to or less than the predetermined threshold as the evaluation value of the effect on the human body.

According to another aspect of the present invention, an apparatus for evaluating an effect of electromagnetic waves radiated from a mobile communication base station near the mobile communication base station on a human body includes: electric field sensors measuring the electric field strength; and a data processing unit connected to communicate with the electric field sensors to receive data corresponding to the intensity of the electric field measured by the electric field sensors, wherein the electric field sensor measures the intensity of the electric field for 6 minutes at a first measurement point which is a predetermined measurement point for acquiring a whole body average of the effect on the human body and transfers the data corresponding to the measurement intensity of the electric field to the data processing unit, and the data processing unit calculates and compares a 6-minute average value and an average value for a first time period which is less than 6 minutes based on the measurement result of the intensity of the electric field measured for 6 minutes to judge whether a standard deviation which is a standard deviation of the 6-minute average value and the average value for the first time period is equal to or less than a predetermined threshold and determines the average value of measurement values for the first time period at the measurement points when the standard deviation is equal to or less than the predetermined threshold as an evaluation value of the effect on the human body.

The number of the electric field sensors may be two or more and the data processing unit may further include a display unit to display a processing result to a user.

Advantageous Effects

According to the present invention, at the time of measuring the strength of electromagnetic waves near a mobile communication base station in order to evaluate a human body exposure amount, the same effect can be acquired by measurement for 1 minute which is reduced by ⅙ or more as compared with an average time period presented by ICNIRP. As the measurement time period is reduced, an effect of reducing cost caused by measurement can be achieved and as the number of measurement points increases, an effect of saving a time period and cost is further increased.

DESCRIPTION OF DRAWINGS

FIG. 2 is a table comparing a site measurement result targeting seven base stations and uncertainty by repetitive measurement.

BEST MODE

Advantages and characteristics of the present invention, and methods for achieving them will be apparent with reference to embodiments described below in detail in addition to the accompanying drawings. However, the present invention is not limited to the exemplary embodiments to be described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Meanwhile, terms used in the specification are used to explain the embodiments and not to limit the present invention. In the specification, a singular type may also be used as a plural type unless stated specifically. "comprises" and/or "comprising" used the specification mentioned constituent members, steps, operations and/or elements do not exclude the existence or addition of one or more other components, steps, operations and/or elements.

Hereinafter, a method for evaluating an effect of electromagnetic fields near a base station on a human body according to an exemplary embodiment of the present invention will be described in detail with reference to the accompanying drawings.

Figure 1:
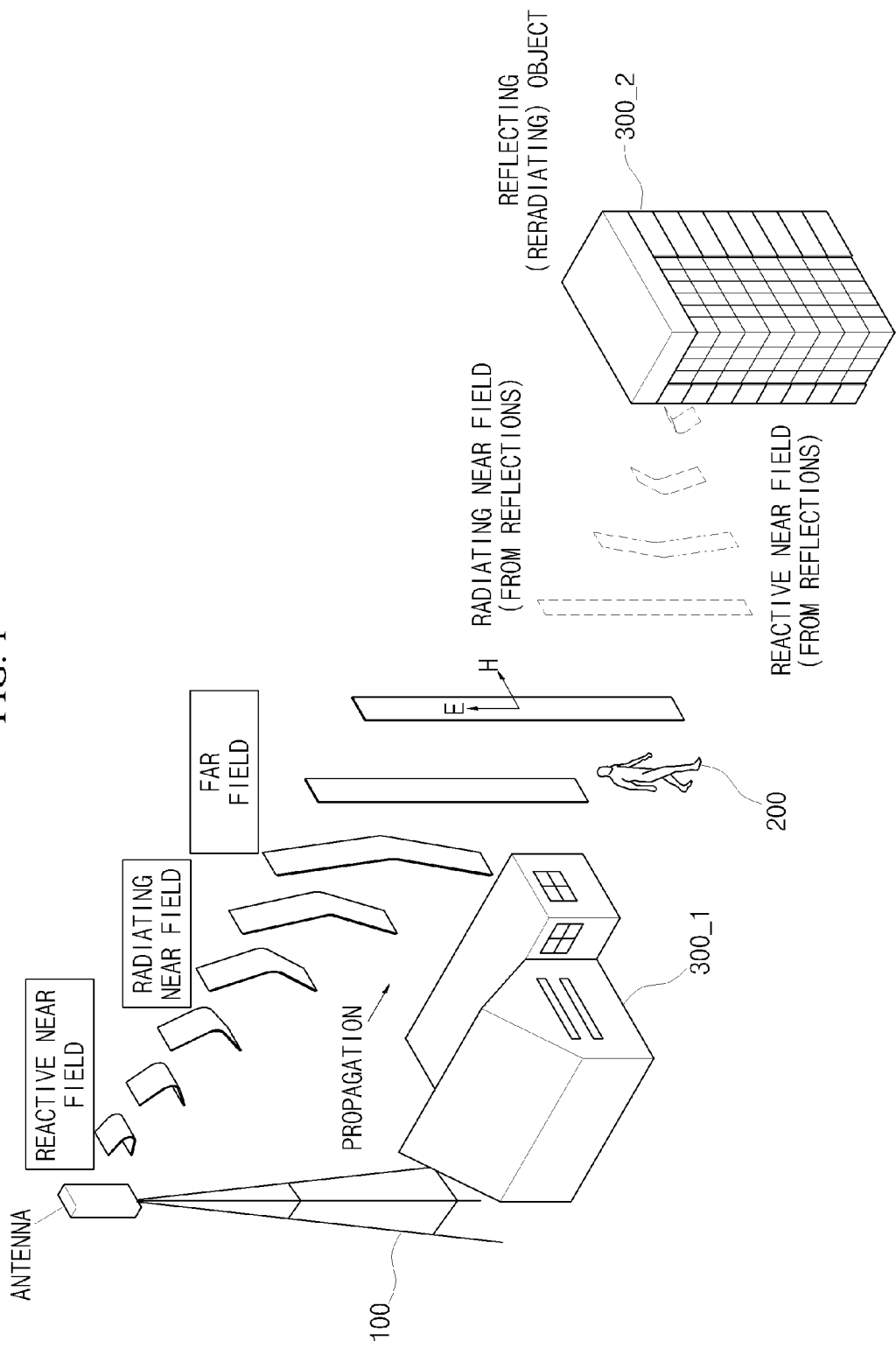
FIG. 1 is a conceptual diagram showing a field to which a method for evaluating an effect of electromagnetic fields near a base station on a human body according to an exemplary embodiment of the present invention is applied.

FIG. 1 is a conceptual diagram showing a field to which a method for evaluating an effect of electromagnetic fields near a base station on a human body according to an exemplary embodiment of the present invention is applied.

As shown in FIG. 1, the method for evaluating an effect of electromagnetic fields near a base station on a human body according to the exemplary embodiment of the present invention is to measure the effect of the electromagnetic fields exerted on the human body when a person 200 is present within a far field of the electromagnetic fields propagated from a mobile communication base station 100.

A wave front of the electromagnetic fields propagated in the far field is theoretically flat as shown in FIG. 1, and as a result, intensities of an electric field and a magnetic field are uniform within a plane vertical to an electromagnetic wave direction. However, due to various reflectors 300_1 and 300_2 near the base station 100 and the human body 200, an exposure amount depends on a measurement position even though the human body is spaced apart from the base station 100 by the same distance.

According to the standard for ICNIRP, at the time when evaluating the exposure amount in the far field, the exposure amount is measured under a condition in which the effect on the human body is excluded, i.e., in the absence of body to perform comparative evaluation with a reference level.

However, in actual measurement, since it is difficult to acquire a whole body average value considering electromagnetic field values at numerous locations in a space occupied by a whole body, various researches for determining an appropriate measurement area and the number of measurement points were performed. According to K.61 which is the recommendation of ITU-T SG5, a spatially averaged value is acquired with respect to 3 to 20 measurement points in the space occupied by the human body in order to evaluate a human body exposure amount by the electromagnetic fields near the base station.

Further, at each measurement point, the ICNIRP recommends that the exposure amount is measured at a frequency band of 10 KHz or more in an effective mode (root means square, rms) for 6 minutes and an arithmetic averaging value thereof is acquired ($68/f^{1.05}$ minute (f: frequency, unit: GHz) at 10 GHz or more). Accordingly, as the number of the measurement points increases, a measurement time period also significantly increases.

Herein, the measurement time period of 6 minutes recommended by the ICNIRP is a valued induced from a human body time constant and is determined by considering a steady-state reaching time period depending on partial body heating by external stimulation.

However, since the reference level is measured in the absence of body, the average time period of 6 minutes induced from the human body time constant is not particularly needed in the case of the measurement performed in the far field and when there is no difference from the 6-minute average value, an appropriate measurement time period of 6 minutes or less may be adopted.

As a result, in the method for evaluating an effect of electromagnetic fields near a base station on a human body according to the exemplary embodiment of the present invention, a site measurement result targeting 7 base stations and uncertainty by repetitive measurement are compared with each other in order to shorten a measurement time period of the electromagnetic fields and a result thereof is shown in FIG. 2.

In the measurement, 3 base stations (1, 2, and 3 of a table of FIG. 2) installed in a downtown, 2 base stations (4 and 5) in a secondary center of a city, and 2 base stations (6 and 7) in an open land are selected in order to consider various measurement environments and a receiving probe is installed at a height of 1.5 m from the ground and thereafter, the measurement is performed. The measurement is performed for 6 minutes according to the reference and every 10 seconds from 180 seconds which is a half of a reference value.

In FIG. 2, a measurement value depending on a reference (360 seconds) and a difference in the intensity of the electric field with respect to measurement time periods of 180, 120, 120, 60, 50, 40, 30, 20, and 10 seconds are shown and as shown in FIG. 1, the measurement values according to the time period do not show a significant difference.

Figure 3:
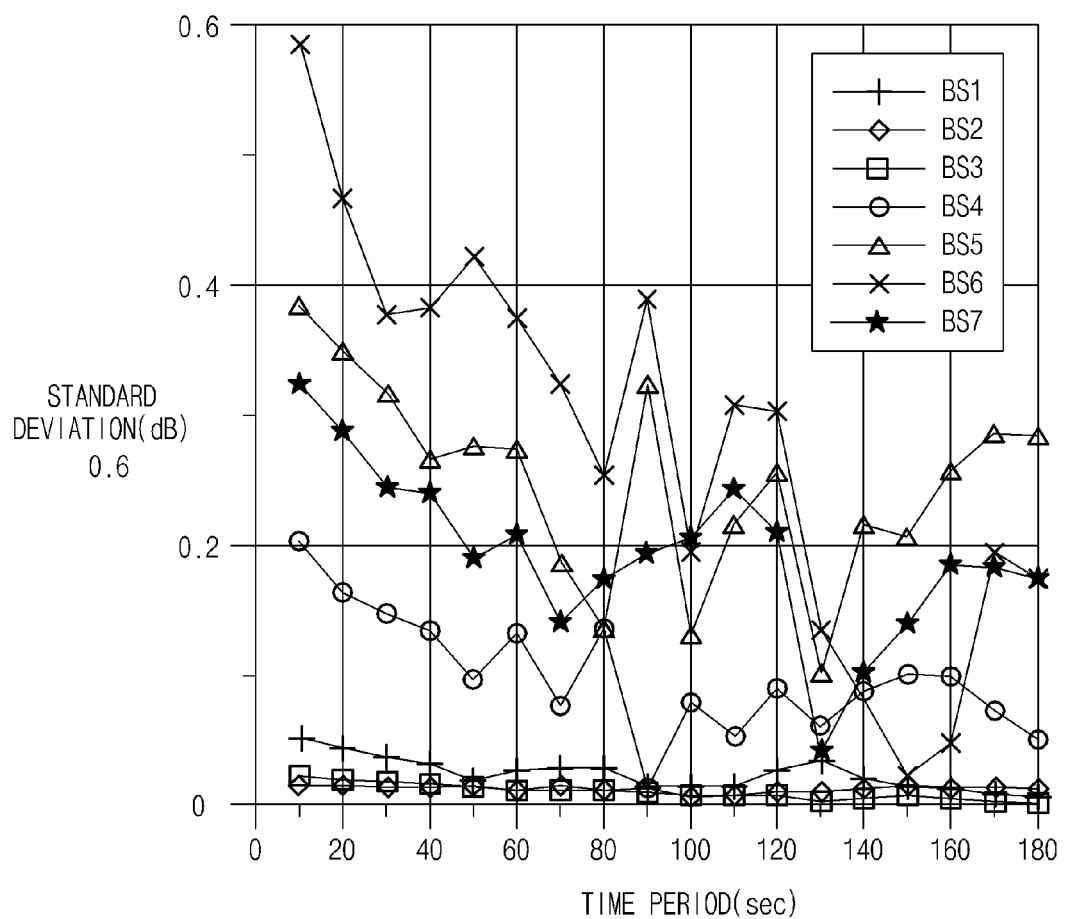
FIG. 3 is a graph showing a standard deviation between an average value for 6 minutes and an average value for a reduced time period according to an exemplary embodiment of the present invention with respect to the seven base stations.

FIG. 3 is a graph showing a standard deviation of the 6-minute average value based on the reference and the values measured every 10 seconds from 180 seconds with respect to each of the 7 base stations.

As shown in FIG. 3, when compared with the 6-minute average value, the maximum value of the standard deviation is 0.58 dB (a 10-minute average of base station 1).

On the basis of the result, by comparing the standard deviation value with 0.4 dB (t-distribution, t0.025=20.5, degree of freedom; 29) which is a measurement drift value by continuous measurement, 60 seconds which has a value smaller than 0.4 dB may be selected as a reducible time period in all the base stations.

Figure 4:
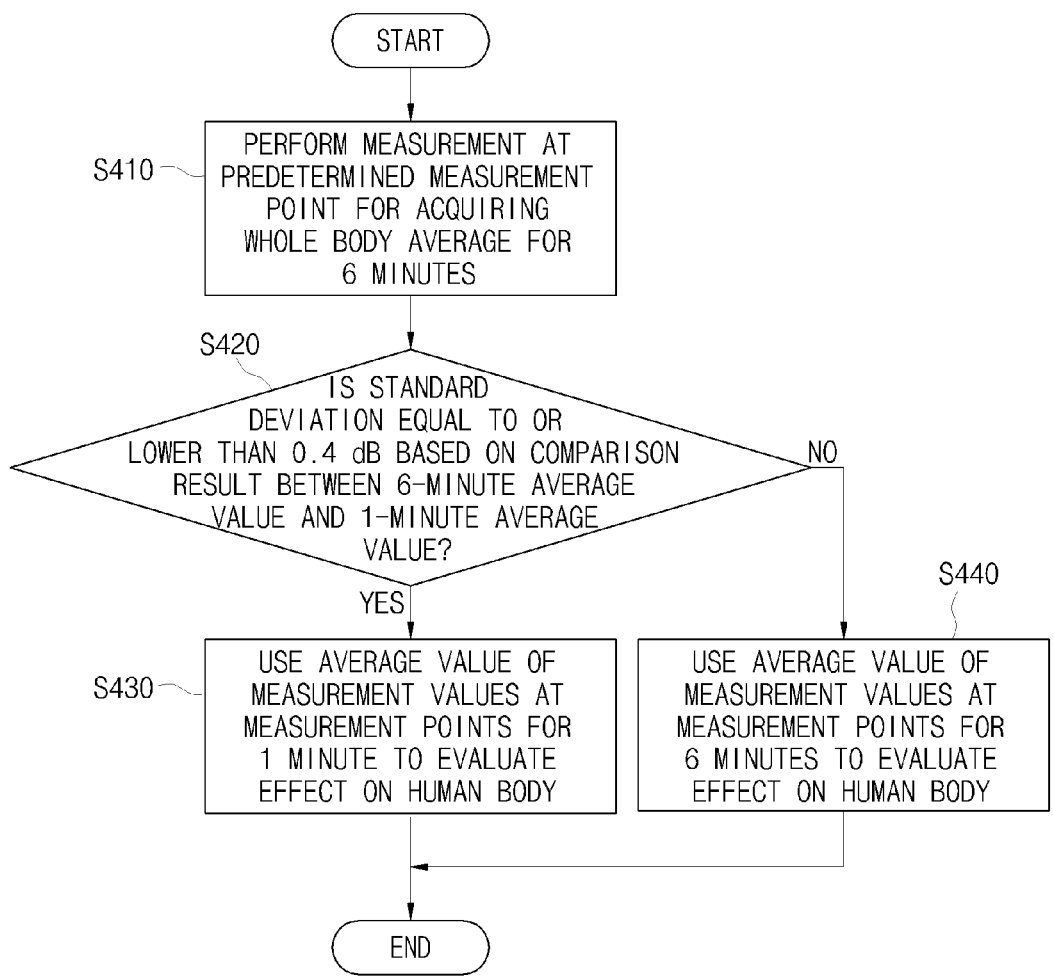
FIG. 4 is a flowchart showing a method for evaluating an effect of electromagnetic fields near a base station on a human body according to an exemplary embodiment of the present invention.

FIG. 4 is a flowchart showing a method for evaluating an effect of electromagnetic fields near a base station on a human body according to an exemplary embodiment of the present invention.

As shown in FIG. 4, first, the 6-minute measurement is performed at a predetermined measurement point for acquiring the whole body average of the effect on the human body (S410).

Next, a 6-minute average value and a 1-minute average value are calculated based on the measurement result of step S410 to judge whether the standard deviation is equal to or lower than 0.4 dB (S420). The 1-minute average value may be calculated by sampling and averaging data for 1 minute among the 6-minute measurement result.

Based on the judgment result of step S420, when the standard deviation is equal to or lower than 0.4 dB, it is judged to be sufficient even by 1-minute measurement, and as a result, an average value of measurement values at the measurement points for 1 minute is used to evaluate the effect on the human body (S430). However, based on the judgment result of step S420, when the standard deviation is higher than 0.4 dB, an average value of the 6-minute measurement values based on the reference is used to evaluate the effect on the human body instead of the 1-minute measurement value (S440).

Meanwhile, in the exemplary embodiment of the present invention shown in FIG. 4, the measurement is performed at a predetermined measurement for 6 minutes and the 6-minute average value and the 1-minute average value are compared with each other and when the standard deviation is higher than 0.4 dB, the 6-minute average value based on the reference is used, but it does not particularly intend to limit a predetermined time period such as 1 minute, however, an average for a predetermined time period which is smaller than 6 minutes may, of course, be acquired and used. For example, when the standard deviation is higher than 0.4 dB based on the comparison result between the 6-minute average value and the 1-minute average value, the average for the reduced time period is acquired by increasing the time period at a predetermined time period interval to select a time period at which the standard deviation is equal to or lower than 0.4 dB, and as a result, a value measured for the corresponding time period may be used to evaluate the effect on the human body.

Figure 5:
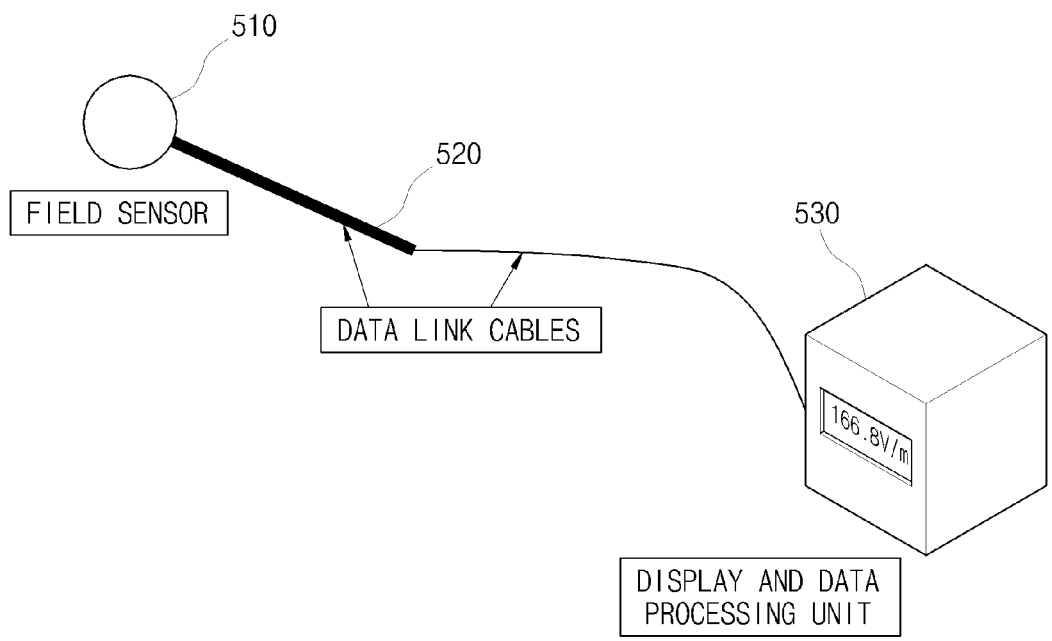
FIG. 5 is a diagram schematically showing a measurement apparatus for performing a method for evaluating an effect of electromagnetic fields near a base station on a human body according to an exemplary embodiment of the present invention.

FIG. 5 is a diagram schematically showing a measurement apparatus for performing a method for evaluating an effect of electromagnetic fields near a base station on a human body according to an exemplary embodiment of the present invention.

As shown in FIG. 5, the measurement apparatus of the effect on the human body according to the exemplary embodiment of the present invention includes an electric field (magnetic field) sensor 510 and a data processing unit 530 and the sensor 510 and the data processing unit 530 are connected to communicate with each other. In FIG. 5, the sensor 510 and the data processing unit 530 are connected with each other through a data link cable 520, but a connection method between the sensor 510 and the data processing unit 530 is not particularly limited and may communicate with each other wirelessly.

In the method for evaluating an effect of electromagnetic fields near a base station on a human body according to the exemplary embodiment of the present invention, the sensor 510 is positioned at the measurement point to measure the electric field (magnetic field) and a measurement value is transferred to the data processing unit 530. The data processing unit 530 calculates a temporarily averaged value based on the measurement result, calculates the standard deviation based on the comparison result, and calculates the average value of the measurement values of all the measurement points.

The data processing unit 530 may further include a display unit to display the measurement result, and the like to a user.

Further, the measurement is performed at two or more measurements by using two or more electric field (magnetic field) sensors 510 and the data processing unit 530 may, of course, process a measurement value received from each sensor 510.

As described above, in the method for evaluating an effect of electromagnetic fields near a base station on a human body according to the exemplary embodiment of the present invention, based on the point that the reference value is measured in the absence of body, the exposure amount can be measured for the reduced time period, thereby saving a time period and a cost required to evaluate the effect of the electromagnetic fields near the base station on the human body. In particular, as the number of measurement points for acquiring the spatially averaged value increases, a reduction effect of the required time period and cost becomes larger.

Although preferred embodiments of the present invention have been disclosed for illustrative purposes, the present invention are not limited to the above-mentioned embodiments and various modification and variations are possible, without departing from the scope and spirit of the invention as disclosed in the accompanying claims. Accordingly, the modifications or changes included in the spirit of the present invention will be included in the appended claims.

The invention claimed is:

1. A method for evaluating an effect of electromagnetic fields radiated from a mobile communication base station on a human body near the mobile communication base station, the method comprising:

measuring the electric field strength for 6 minutes at a first measurement point which is a predetermined measurement point for acquiring a whole body average of the effect on the human body;

calculating and comparing a 6-minute average value and an average value for a first time period which is less than 6 minutes based on the measurement result of the electric field strength measured for 6 minutes to judge whether a first standard deviation which is a standard deviation of the 6-minute average value and the average value for the first time period is equal to or less than a predetermined threshold; and determining the average value of measurement values for the first time period at the measurement points when the first standard deviation is equal to or less than the predetermined threshold as an evaluation value of the effect on the human body.

2. The method for evaluating an effect of electromagnetic fields near a mobile base station on a human body according to claim 1, wherein the first time period is 1 minute.

3. The method for evaluating an effect of electromagnetic fields near a mobile base station on a human body according to claim 1, wherein the threshold is 0.4 dB.

4. The method for evaluating an effect of electromagnetic fields near a mobile base station on a human body according to claim 1, further comprising determining an average value of measurement values for 6 minutes at the measurement points as the evaluation value of the effect on the human body when the first standard deviation is more than the predetermined threshold.

5. The method for evaluating an effect of electromagnetic fields near a mobile base station on a human body according to claim 1, further comprising:
calculating and comparing the 6-minute average value and an average value for a second time period acquired by adding a first time interval to the first time period when the first standard deviation is more than the threshold to judge whether a second standard deviation which is a standard deviation between the 6-minute average value and an average value for the second time period is equal to or less than the threshold; and
determining the average value of measurement values for the second time period at the measurement points when the second standard deviation is equal to or less than the predetermined threshold as the evaluation value of the effect on the human body.

6. An apparatus for evaluating an effect of electromagnetic fields radiated from a mobile communication base station on a human body near the mobile communication base station, the apparatus comprising:
electric field sensors measuring the electric field strength; and
a data processing unit connected to communicate with the electric field sensors to receive data corresponding to the electric field strength measured by the electric field sensors,
wherein the electric field sensor measures the electric field strength for 6 minutes at a first measurement point which is a predetermined measurement point for acquiring a whole body average of the effect on the human body and transfers the data corresponding to the measurement electric field strength to the data processing unit, and
the data processing unit calculates and compares a 6-minute average value and an average value for a first time period which is less than 6 minutes based on the measurement result of the electric field strength measured for 6 minutes to judge whether a standard deviation which is a standard deviation of the 6-minute average value and the average value for the first time period is equal to or less than a predetermined threshold and determines the average value of measurement values for the first time period at the measurement points when the standard deviation is equal to or less than the predetermined threshold as an evaluation value of the effect on the human body.

7. The apparatus for evaluating an effect of electromagnetic fields near a mobile base station on a human body according to claim 6, wherein the number of the electric field sensors is two or more.

8. The apparatus for evaluating an effect of electromagnetic fields near a mobile base station on a human body according to claim 6, wherein the data processing unit further includes a display unit to display a processing result to a user.

9. The apparatus for evaluating an effect of electromagnetic fields near a mobile base station on a human body according to claim 6, wherein the first time period is 1 minute.

10. The apparatus for evaluating an effect of electromagnetic fields near a mobile base station on a human body according to claim 6, wherein the threshold is 0.4 dB.

* * * * *